United States Patent
Merry et al.

(10) Patent No.: US 9,429,248 B2
(45) Date of Patent: Aug. 30, 2016

(54) PROCESS CHAMBER GAS FLOW APPARATUS, SYSTEMS, AND METHODS

(71) Applicant: Applied Materials, Inc., Santa Clara, CA (US)

(72) Inventors: Nir Merry, Mountain View, CA (US); Chandrakant M. Sapkale, Karnataka (IN); Karuppasamy Muthukamtchi, Tamil Nadu (IN); Jeffrey C. Hudgens, San Francisco, CA (US); Penchala N. Kankanala, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 263 days.

(21) Appl. No.: 14/091,130

(22) Filed: Nov. 26, 2013

(65) Prior Publication Data

US 2014/0150878 A1   Jun. 5, 2014

Related U.S. Application Data

(60) Provisional application No. 61/732,186, filed on Nov. 30, 2012.

(51) Int. Cl.
| | |
|---|---|
| *F16K 51/00* | (2006.01) |
| *F16K 31/00* | (2006.01) |
| *F16K 51/02* | (2006.01) |
| *F16K 1/24* | (2006.01) |
| *C23C 16/44* | (2006.01) |

(52) U.S. Cl.
CPC ............ *F16K 51/00* (2013.01); *C23C 16/4412* (2013.01); *F16K 1/24* (2013.01); *F16K 31/00* (2013.01); *F16K 51/02* (2013.01); *Y10T 137/0318* (2015.04); *Y10T 137/8593* (2015.04)

(58) Field of Classification Search
CPC .......... F16K 51/00; F16K 1/24; F16K 51/02; F16K 31/00; F16K 31/44; F16K 31/58; C23C 16/4412; Y10T 137/0318; Y10T 137/8593
USPC .............. 251/86, 298, 129.2, 228, 229, 340; 137/1, 561 R; 239/577
See application file for complete search history.

(56) References Cited

U.S. PATENT DOCUMENTS

| | | | | |
|---|---|---|---|---|
| 4,251,053 A | * | 2/1981 | Wurzer ...................... | F16K 7/16 137/855 |
| 4,354,640 A | * | 10/1982 | Hans .................... | F02M 51/065 239/533.9 |
| 5,452,878 A | * | 9/1995 | Gravesen .................. | F15C 5/00 251/129.01 |
| 5,501,427 A | * | 3/1996 | Ando .................... | F16K 1/2007 251/228 |
| 5,667,197 A | * | 9/1997 | Boyd ........................ | F16K 3/18 137/559 |

(Continued)

OTHER PUBLICATIONS

International Search Report and Written Opinion of International Application No. PCT/US2013/072079 mailed Mar. 4, 2014.

(Continued)

*Primary Examiner* — John Bastianelli
(74) *Attorney, Agent, or Firm* — Dugan & Dugan, PC

(57) ABSTRACT

Process chamber gas flow control apparatus having a tiltable valve are disclosed. The gas flow apparatus includes a process chamber adapted to contain a substrate, an exit from the process chamber including a valve seat, and a tiltable valve configured and adapted to tilt relative to the valve seat to control flow non-uniformities within the process chamber. Systems and methods including the tiltable valve apparatus are disclosed, as are numerous other aspects.

20 Claims, 11 Drawing Sheets

(56) References Cited

U.S. PATENT DOCUMENTS

| | | | |
|---|---|---|---|
| 5,954,079 A | 9/1999 | Barth et al. | |
| 6,079,693 A * | 6/2000 | Ettinger | F16K 3/188 251/175 |
| 6,192,827 B1 * | 2/2001 | Welch | H01J 37/32458 118/723 E |
| 6,592,709 B1 | 7/2003 | Lubomirsky | |
| 6,708,945 B2 | 3/2004 | Horiuchi et al. | |
| 7,497,414 B2 * | 3/2009 | Lee | F16K 1/24 251/177 |
| 7,845,618 B2 * | 12/2010 | Kim | F16K 1/24 251/177 |
| 2006/0222481 A1 | 10/2006 | Foree | |
| 2006/0266962 A1 * | 11/2006 | Kanzaka | F16K 51/02 251/63.6 |
| 2009/0272324 A1 | 11/2009 | Balasubramanyam et al. | |
| 2009/0320948 A1 * | 12/2009 | Asanuma | F16K 1/16 137/627.5 |
| 2010/0099266 A1 | 4/2010 | Oswald et al. | |
| 2011/0095220 A1 * | 4/2011 | Geiser | F16K 51/02 251/298 |
| 2011/0140023 A1 * | 6/2011 | Sauer | F16K 49/007 251/298 |
| 2011/0186762 A1 * | 8/2011 | Geiser | F16K 51/02 251/303 |
| 2011/0265887 A1 * | 11/2011 | Lee | H01L 21/67017 137/334 |
| 2012/0034136 A1 | 2/2012 | Collins et al. | |
| 2012/0045903 A1 | 2/2012 | Harada | |

OTHER PUBLICATIONS

International Preliminary Report on Patentability of International Application No. PCT/US2013/072079 mailed Jun. 11, 2015.
Merry et al., U.S. Appl. No. 14/091,111, titled: Process Chamber Apparatus, Systems, and Methods for Controlling a Gas Flow Pattern, filed Nov. 26, 2013.

* cited by examiner

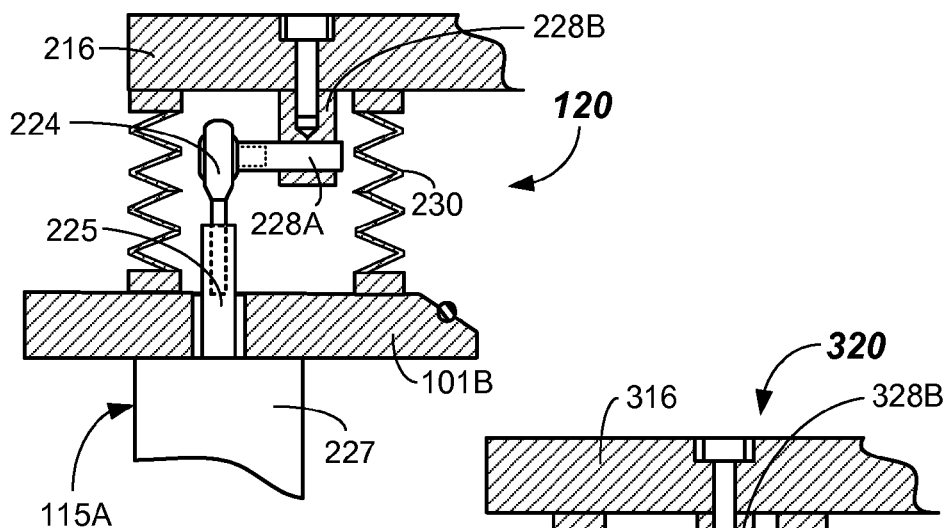
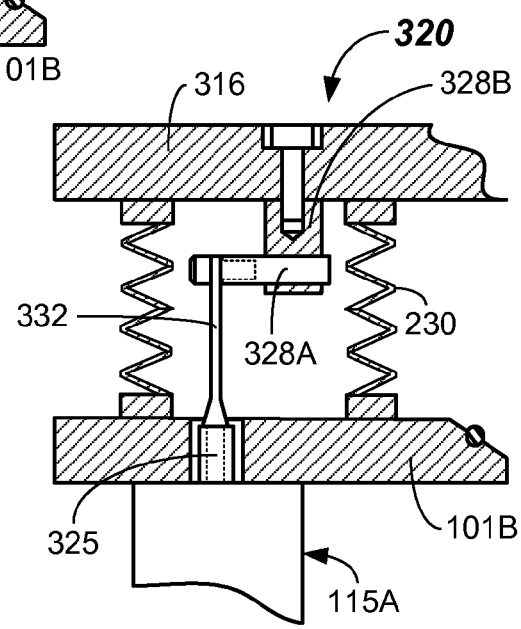
FIG. 2
FIG. 3
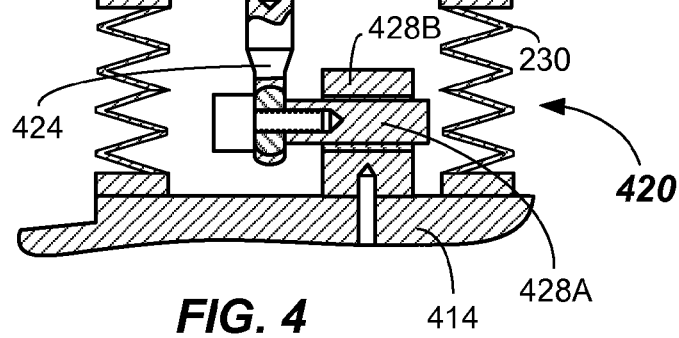
FIG. 4

PROCESS CHAMBER GAS FLOW APPARATUS, SYSTEMS, AND METHODS

RELATED APPLICATIONS

The present application claims priority from U.S. Provisional Patent Application Ser. No. 61/732,186, filed Nov. 30, 2012, entitled "PROCESS CHAMBER GAS FLOW APPARATUS, SYSTEMS, AND METHODS" which is hereby incorporated herein by reference in its entirety for all purposes.

FIELD

The present invention relates to electronic device manufacturing, and more specifically to process chamber gas supply apparatus, systems, and methods thereof.

BACKGROUND

Conventional electronic device manufacturing systems may include one or more process chambers that are adapted to carry out any number of processes, such as degassing, cleaning or pre-cleaning, deposition such as chemical vapor deposition (CVD), physical vapor deposition (PVD), or atomic layer deposition, coating, oxidation, nitration, etching (e.g., plasma etch), or the like. Each of the process chambers may be included in a cluster tool where a plurality of process chambers may be distributed about a generally central transfer chamber, for example. These tools may employ a transfer robot that may be housed within the transfer chamber to transport substrates to and from the various process chambers. Conventionally, a slit valve is provided between the transfer chamber and each process chamber. An end effector (e.g., blade) of the transfer robot passes through the slit valve to place or extract a substrate (e.g., a silicon wafer, glass plate, or the like) into or from a support (e.g., a pedestal or lift pins) provided within the process chamber.

Once the substrate is properly disposed within the process chamber, the slit valve may be closed, and the processing of the substrate may commence. As part of the processing, certain process gases may be introduced into the process chamber. Under some conditions, the flow in the process chamber may be non-uniform, which can lead to non-uniform processing (e.g., non-uniform etching, deposition, or the like). Various methods of controlling the gas flow in the process chamber have been previously used, such as using multiple inflow conduits and valves. However, such gas flow control systems tend to be very complicated and expensive, and still may not adequately address flow non-uniformities.

Accordingly, improved process chamber gas flow apparatus, systems, and methods are desired.

SUMMARY

In one embodiment, a process chamber gas flow control apparatus is provided. The process chamber gas flow control apparatus includes a process chamber adapted to contain a substrate, an exit from the process chamber including a valve seat, and a tiltable valve configured and adapted to tilt relative to the valve seat to control a gas flow pattern within the process chamber.

In another aspect, an electronic device processing system is provided. The electronic device processing system includes a process chamber adapted to contain a substrate, a process gas inlet to the process chamber, and a process gas exit from the process chamber including a valve seat and a tiltable valve, the tiltable valve being configured and adapted to tilt relative to the valve seat to adjust a gas flow pattern within the process chamber.

In another aspect, a method of controlling flow of a process gas within a process chamber is provided. The method includes providing a process chamber, providing a process gas exit including a valve seat and a tiltable valve, and adjusting a flow pattern in the process chamber by tilting the tiltable valve relative to the valve seat.

Numerous other features are provided in accordance with these and other aspects of the invention. Other features and aspects of embodiments of the present invention will become more fully apparent from the following detailed description, the appended claims and the accompanying drawings.

BRIEF DESCRIPTION OF THE DRAWINGS

FIG. 2 illustrates a cross-sectioned partial side view of a combination ball and linear joint coupled to the tiltable valve and adapted to accommodate angular misalignment and foreshortening displacement according to embodiments.

FIG. 3 illustrates a cross-sectioned partial side view of an alternative angular misalignment and foreshortening apparatus coupled to the tiltable valve and adapted to accommodate rotation and foreshortening displacement according to embodiments.

FIG. 4 illustrates a cross-sectioned partial side view of another alternative angular misalignment and foreshortening apparatus coupled to the tiltable valve and adapted to accommodate rotation and foreshortening displacement according to embodiments.

DETAILED DESCRIPTION

Electronic device manufacturing may use pressure control within a process chamber in order to control a rate of processing or other parameters. Prior art process gas flow control systems have included a gas supply that provides a supply of process gas at a top of the process chamber, a gas exit at a side or bottom of the process chamber. In some bottom-exit systems, a butterfly valve may be provided that is spaced a distance away from the exit and may be used to control overall flow rate or conductance. A suitable pump, such as a turbo pump, may operate with the process gas flow control system and be located below the exit. Such process gas flow control systems, especially side-exit systems, may experience non-uniform flow patterns within the process chamber. However, even bottom flow systems may experience flow non-uniformities. This non-uniform flow may cause uneven processing or other problems such as uneven deposition, uneven etching, and the like. Accordingly, process chamber gas flow control systems that are adapted to better control flow patterns (e.g., flow non-uniformities) within the process chamber are desired.

To solve one or more of these problems, embodiments of the present invention provide an improved process chamber gas flow control apparatus. Systems including the improved process chamber gas flow control apparatus are provided. Moreover, methods of controlling flow of a process gas within a process chamber are also disclosed.

Thus, in one aspect, an improved process chamber gas flow control apparatus is provided. The process chamber gas flow control apparatus includes a valve seat at an exit from a process chamber, and a tiltable valve configured and adapted to tilt relative to the valve seat. Multiple actuators may be used to accomplish the tilting of the tiltable valve relative to the valve seat. Process chamber gas flow control apparatus may be used to control gas flow patterns within the process chamber. In one or more embodiments, control of a degree of tilt of the tiltable valve may be used to minimize flow non-uniformities within the process chamber. Tilting of the tiltable valve may be provided about multiple axes, thus improved flow uniformity in proximity of the substrate being processed in the process chamber may be provided.

In another aspect, an electronic device processing system is provided. The electronic device processing system includes a process chamber adapted to contain a substrate, a process gas inlet, a process gas exit from the process chamber. The process gas exit includes a valve seat and a tiltable valve. The tiltable valve is configured and adapted to tilt relative to the valve seat to adjust a gas flow pattern within the process chamber.

Further details of example embodiments illustrating and describing various aspects of the invention, including apparatus, systems and method aspects, are described with reference to FIGS. 1A-13 herein.

Figure 1A:
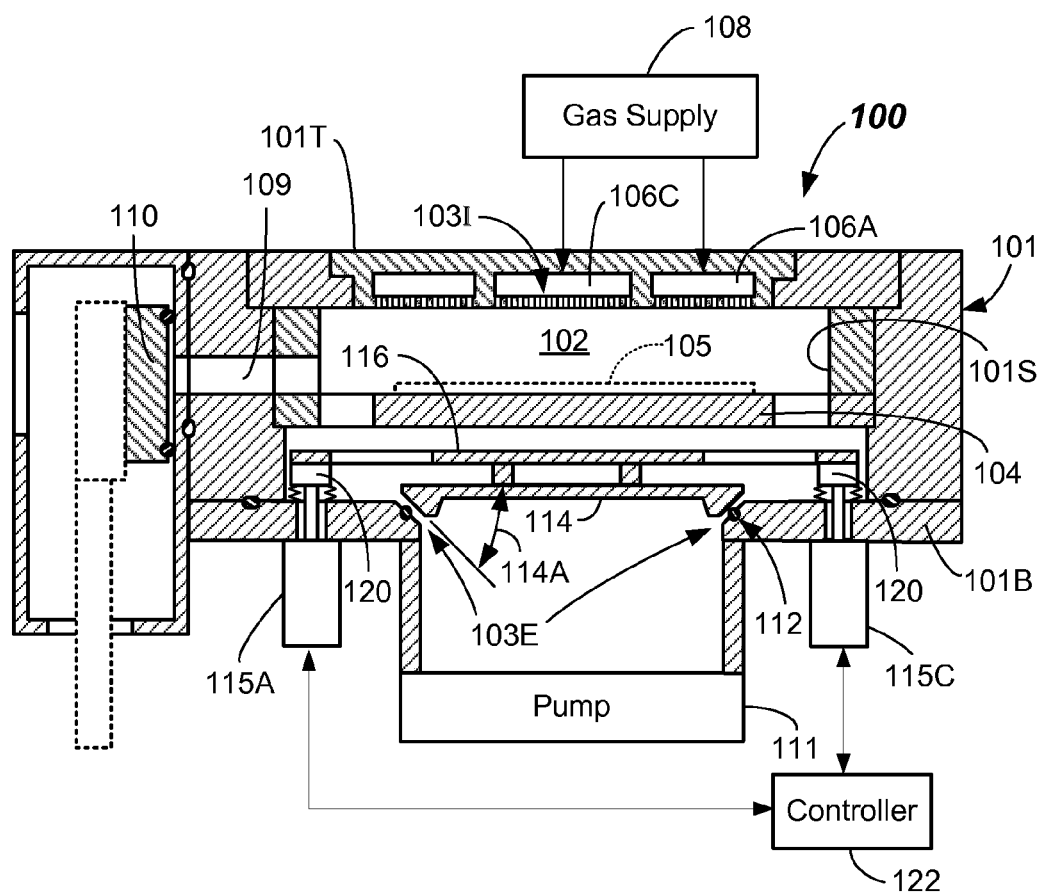
FIG. 1A illustrates a cross-sectioned side view of an electronic device processing system including a process chamber gas flow control apparatus including a tiltable valve according to embodiments.

FIG. 1A illustrates a cross-sectioned side view of an example embodiment of an electronic device processing system 100. The electronic device processing system 100 may be adapted to process substrates (e.g., silicon-containing wafers, plates, discs, or the like) by imparting one or more processes thereto, such as degassing, cleaning or pre-cleaning, deposition such as chemical vapor deposition (CVD), physical vapor deposition (PVD), or atomic layer deposition, coating, oxidation, nitration, etching (e.g., plasma etch), or the like. Other processes may be carried out. The depicted electronic device processing system 100 includes a housing 101 including a process chamber 102 formed by walls thereof. The chamber housing 101 includes top 101T, which may contain a process gas inlet 103I to the process chamber 102, and a bottom 101B including a process gas exit 103E from the process chamber 102, and side walls 101S of the process chamber 102. The top 101T, bottom 101B and side walls 101S may at least partially define the process chamber 102. The process chamber 102 may be maintained at a vacuum, for example.

In the depicted embodiment, the process chamber 102 is adapted to contain a substrate 105 (shown dotted), which may rest upon or otherwise be supported relative to a support structure, such as a pedestal 104 shown. Other types of support structures may be used, such as lift pins. The process gas inlet 103I may be located at an upper portion of the process chamber 102 and may comprise one or more inlet passages adapted to provide one or more process gases into the process chamber 102. In the depicted embodiment, the process gas inlet 103I may include a center region 106C and an outer annular region 106A surrounding the center region 106C where gas from a gas supply 108 may be provided to the regions 106A, 106C. One or more of the afore-mentioned gases may be provided by the gas supply 108. Gas flow rates may be adjusted between the center and outer annular regions 106C, 106A, to at least partially equalize flow distributions within the process chamber 102, for example. Other types of gas inlets may be used, including side gas inlets.

As is conventional, substrates 105 may be provided to and withdrawn from the process chamber 102 through side opening 109 by opening and closing a slit valve 110 or other like sealing member. A general level of vacuum may be provided in the process chamber 102 by an operation of one or more pumps 111 (e.g., one or more turbo pumps) connected below the process gas exit 103E, as is conventional.

In more detail, the process gas exit 103E from the process chamber 102 includes a valve seat 112 and a tiltable valve 114. Tiltable valve 114 is configured and adapted to tilt about one or more axes relative to the valve seat 112. Tilting of the tiltable valve 114 is operational to adjust a gap dimension about a periphery of the tiltable valve 114 relative to the valve seat 112. Adjusting the amount and radial location of a minimum gap dimension is used to adjust a gas flow pattern within the process chamber 102. For example, tilting of the tiltable valve 114 about one axis may cause a relatively larger gap between the tiltable valve 114 and the valve seat 112 on one side of the axis, and a relatively smaller gap between the tiltable valve 114 and the valve seat 112 on the other side of the axis. Thus, increased gas flow is caused to occur adjacent to the larger gap on one side. This resultantly causes relatively higher process gas flow about the pedestal 104 in the radial region where a higher gap is present. This adjustment of the tiltable valve 114 relative to the valve seat 112 may be used to adjust a gas flow pattern within the process chamber 102.

For example, a gas flow pattern may be adjusted to increase flow at any particular radial location about the pedestal 104. Gas flow pattern adjustments may be made by examining a uniformity of the processing taking place on the substrate 105 by examining one or more processed substrates 105. Then, a degree and location of tilt (e.g., radial location of a minimum gap) of the tiltable valve 104 may be controlled to improve the non-uniformity based upon those results. Optionally, the process chamber 102 may be instrumented with pressure or flow sensors as part of a set-up operation.

In one aspect, overall process gas flow rate within the process chamber 102 (e.g., conductance) may also be controlled by raising or lowering the height of the tiltable valve 114 relative to the valve seat 112. In this case, an average gap between the tiltable valve 114 and the valve seat 114 may be increased to increase gas flow rate, or decreased to decrease the process gas flow rate in the process chamber 102.

Figure 1B:
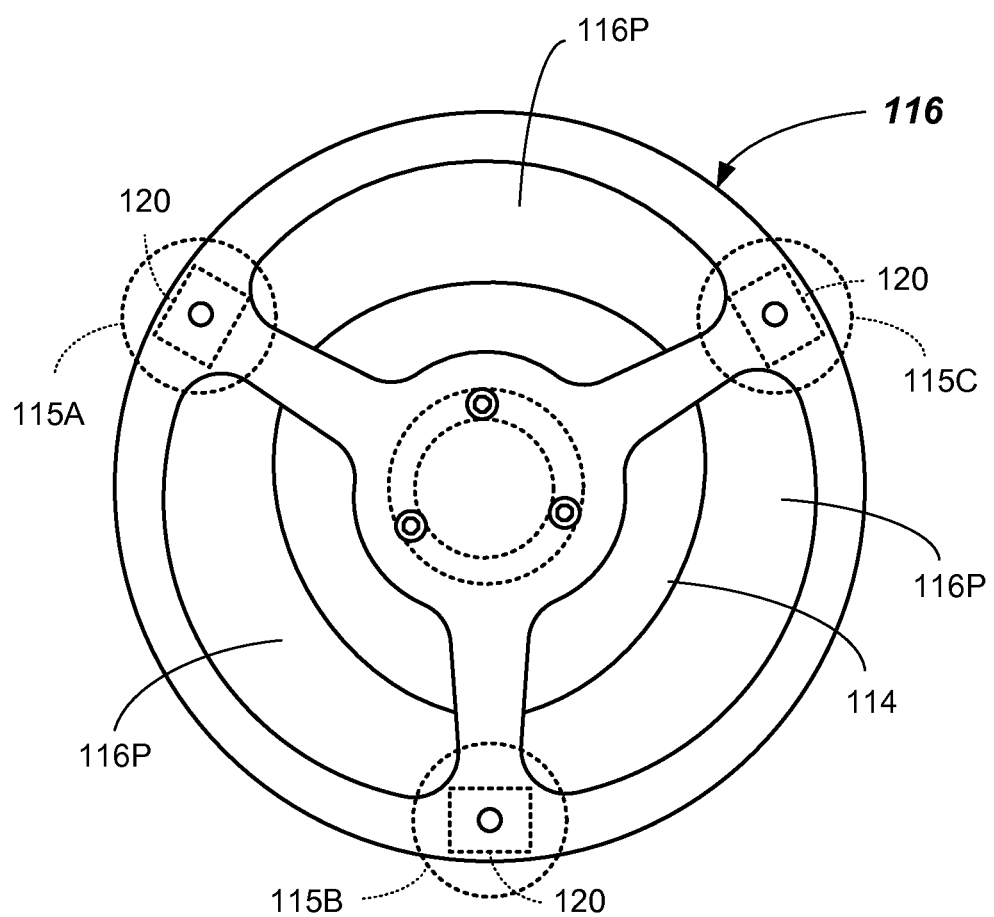
FIG. 1B illustrates a top view of a portion of a tiltable valve according to embodiments.

In the depicted embodiment of FIGS. 1A and 1B, the tiltable valve 114 comprises a single piece disc-shaped structure that may be supported by a support member 116 coupled to an upper side of the tiltable valve 114. The support member 116 may be a disc as shown in FIG. 1B, with radially staggered flow passages 116P formed therein allowing the process gas exiting the process chamber 102 to pass through the flow passages 116P and then through the process gas exit 103E.

The tiltable valve 114 may be constructed of any suitable high temperature rigid material such as stainless steel. Other suitable materials may be used. The tiltable valve 114 and the valve seat 112 may have sealing surfaces that are relatively conical, as shown. The cone angle 114A on the tiltable valve 114 may be less than about 90 degrees, or between about 0 and about 90 degrees in some embodiments, and even between about 5 and 45 degrees in other embodiments. A cone angle on the valve seat 112 may be approximately the same, or slightly different in some embodiments than the cone angle on the tiltable valve 114. An elastomeric seal may be provided on one or both of the sealing surfaces. As shown the seal is provided on the housing bottom 101B. The seal may be a high temperature elastomer material, such as a perfluoroelastomer such as CHEMRAZ® available from Greene, Tweed & Company, for example. Other materials may be used.

The tilting of the tiltable valve 114 relative to the valve seat 112 may be accomplished by any suitable means, such as the action of a plurality of actuators (e.g., actuators 115A-115C). The plurality of actuators (e.g., actuators 115A-115C) may be arranged about the tiltable valve 114, in equally-spaced increments (e.g., at 120 degrees as shown). Possible connection locations are shown as dotted in FIG. 1B. However, other connection locations may be used. In the depicted embodiment, the tiltable valve 114 is coupled to the support member 116 and the plurality of actuators (e.g., actuators 115A-115C) are coupled to the support member 116 by couplings 120. The couplings 120 may include misalignment and/or displacement and may be operable to accommodate both angular misalignment as well as foreshortening due to the angular misalignment.

A controller 122 may interface with and be operative to command the displacement of the plurality of actuators (e.g., actuators 115A-115C) thereby causing the support 116 to move vertically (e.g., raise or lower) to control an overall level of conductance of the process gas flow and/or cause a degree tilt and location of tilt of the tiltable valve 114 relative to the valve seat 112. In this manner, control of a uniformity of the process gas flow in the process chamber 102 may be provided.

Thus, in one aspect, the action of the tiltable valve 114 may open and close the gas exit 103E, including causing the complete sealing of the gas exit 103E. The action of the tiltable valve 114 may be adjusted vertically by moving the plurality of actuators (e.g., actuators 115A-115C) in unison to control a level of overall conductance at a desired level. Tilting of the tiltable valve 114 may be accomplished by actuating at least some or all of the plurality of actuators (e.g., actuators 115A-115C) at different extension amounts (e.g., vertical displacements). Accordingly, variable levels of tilt may be achieved. Tilting of up to about 10 degrees from a horizontal axis may be provided by the actuators. Tilting may be about any axis lying in a plane of the support member 116.

Sealing between the housing bottom 101B and the couplings 120 may be provided by suitable flexible metal bellows or other sealing members. The actuators 115A-115C may be coupled to the couplings 120 and the couplings 120 may be attached to the support member 116. A first example of a coupling 120 is shown in FIG. 2. Various other example embodiments of couplings that may be substituted for coupling 120 are shown in FIGS. 3-4. Other types of couplings and numbers of actuators may be used.

FIG. 2 illustrates a first example embodiment of a coupling 120 having a combination ball joint and linear slide. The coupling 120 includes a combination of a rod end 224 for accommodating angular misalignment, and a slide member for accommodating foreshortening displacement. The rod end 224 may be coupled to a shaft 225 of the actuator 115A. For example, the rod end 224 may be threaded into a threaded hole formed in the end of the shaft 225. Other rod end attachment systems may be used. The rod end 224 may include a spherical ball joint allowing angular misalignment between the housing bottom 101B and the support member 216, and thus angular misalignment of the tiltable valve 114. The body 227 of the actuator 115A may be coupled to the housing bottom 101B, such as by fasteners (not shown). Other fastening means may be used. The other components of the coupling 120 comprise a slide member having a slide 228A and a slide receiver 228B. The slide receiver 228B may be coupled to the support member 216, such as by one or more fasteners. The slide 228A may comprise a cylindrical pin received and slideable in a guide passage of the slide receiver 228B. The guide passage may be a hole formed in the slide receiver 228B, for example. The slide 228A may be integrally formed as part of the inner member of the rod end 224 or otherwise coupled thereto. The coupling 120 may be surrounded by any suitable sealing member 230, such as a flexible steel bellows. Angular misalignment between the housing bottom 101B and the support member 216 is accommodated by the inner member of the rod end 224 pivoting relative to the outer member of the rod end 224, i.e., it is accommodated by the spherical joint formed in the rod end 224. The foreshortening due to angular misalignment is taken up by the slide member by the slide 228A moving and sliding in the slide receiver 228B. The other couplings 120 used may be identical. The axis of the slide 228A is generally oriented towards the center of the support member 116 to which the tiltable valve 114 is coupled (See FIG. 1A).

A similar coupling 320 including a flexure and linear slide is shown in FIG. 3. In this embodiment a flexure 332 is configured and adapted to accommodate the angular misalignment due to tilt of the tilting valve 114. The flexure 332 may be formed from any suitable flexible material, such as a carbon fiber, titanium, steel, and engineered plastic, and may have a circular or rectangular cross section. Other suitable materials and cross sectional shapes may be used as well. The flexure 332 may be coupled to the shaft 325 of the actuator 115A such as by threading. Flexure 332 may be coupled to the slide 328A of the slide member by a suitable fastener. Optionally, the slide 328A may be formed integrally with the flexure 332. As in the previous embodiment, the slide 328A and slide receiver 328B accommodate foreshortening displacement due to tilting between the housing bottom 101B and the support member 316 that is adapted to support the tiltable valve 114. The flexure 332 accommodates the angular misalignment.

Another alternative coupling 420 including a combination ball joint and linear slide is shown in FIG. 4. However, in this embodiment the rod end 424 is coupled to the support member 416 that is adapted to be coupled to and driven by an actuator (See FIG. 8) to accommodate the angular misalignment due to tilt of the tilting valve 114. The slide receiver 428B may be coupled directly to the tiltable valve 414 in this embodiment. As previously described, the linear slide may include a slide 428A that may be a pin that slides in the slide receiver 428B. In each of the described embodiments, a flexible bellows 230 may be used to seal around the coupling 120, 320, and 420.

Figure 5:
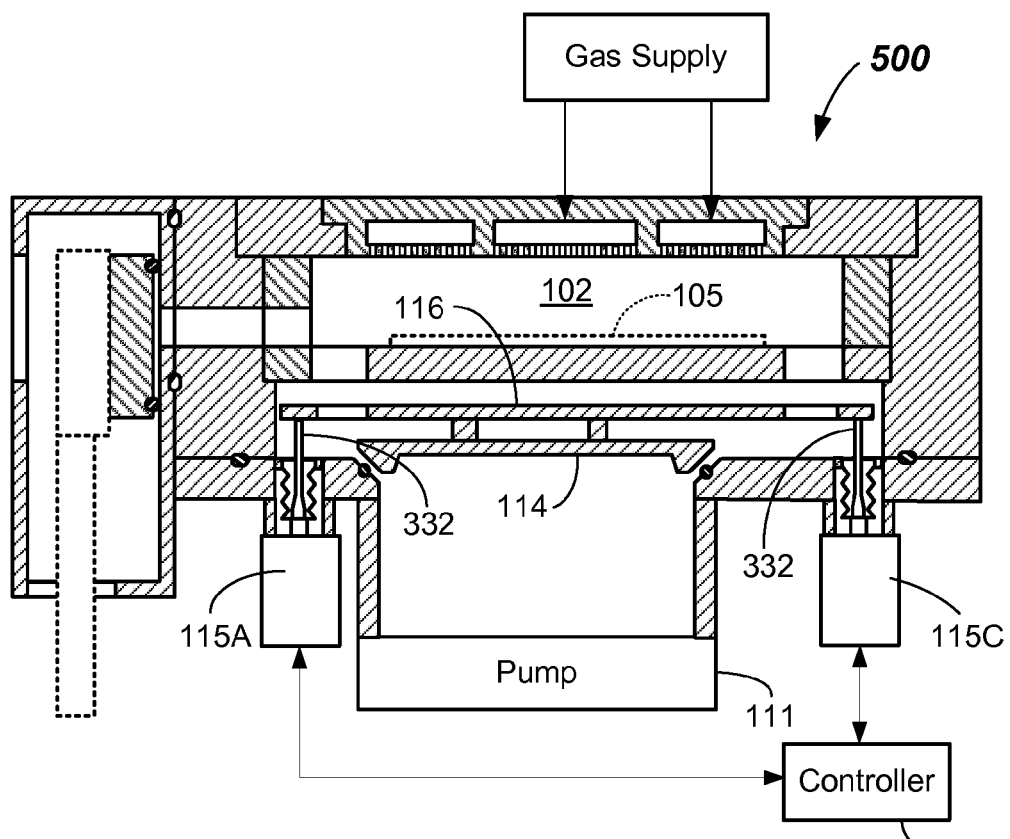
FIG. 5 illustrates a cross-sectioned side view of an alternative embodiment of a process chamber gas flow control apparatus having a tiltable valve mounted on flexures according to embodiments.

FIG. 5 illustrates an electronic device processing system 500 including an alternative tiltable valve assembly having the tiltable valve 114 supported by the support member 116 wherein the actuators 115A-115C are attached directly to the support member 116 by a plurality of flexures 332 and wherein the flexures 332 accommodate both angular misalignment due to tilt of the tiltable valve 114 as well as foreshortening displacement due to the tilt.

Figure 6:
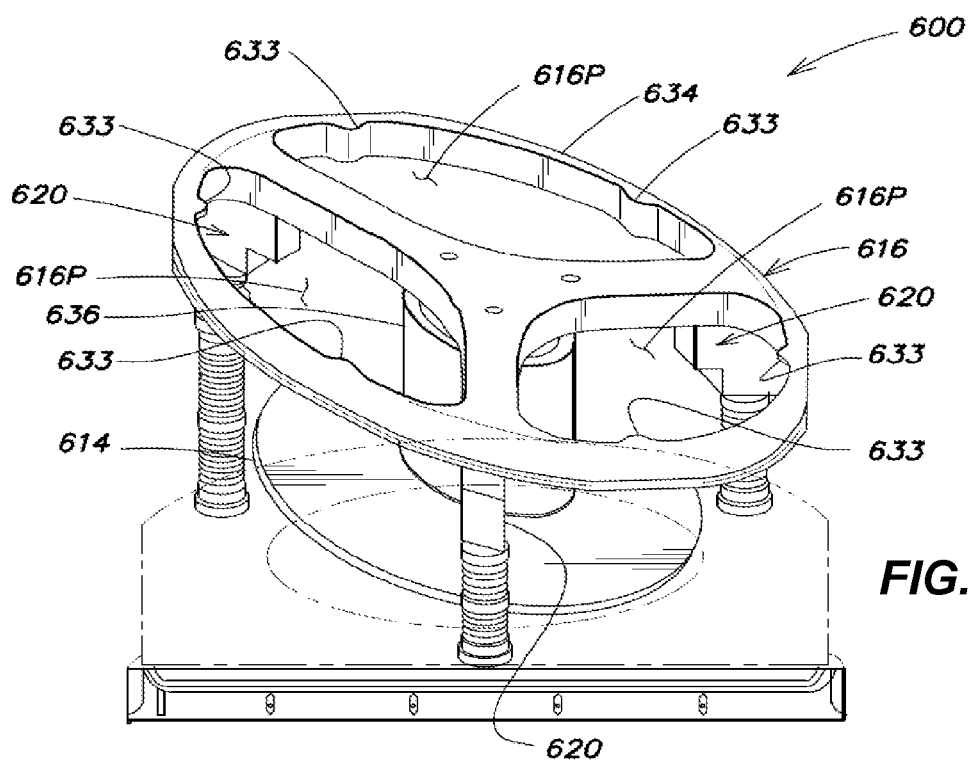
FIG. 6 illustrates an isometric top view of an alternative embodiment of a gas flow control apparatus having a tiltable valve supported by a central support member according to embodiments.
Figure 7:
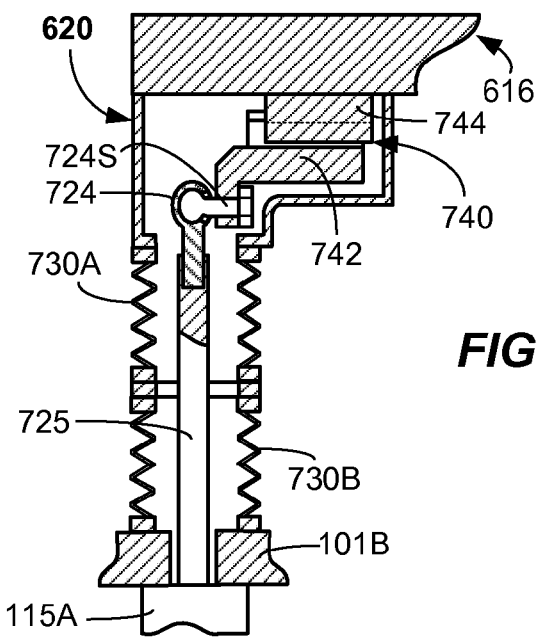
FIG. 7 illustrates a cross-sectioned partial side view of an alternative angular misalignment and foreshortening apparatus according to embodiments.

FIGS. 6 and 7 illustrate an alternative embodiment of the valve assembly 600 and couplings 620 thereof. Valve assembly 600 includes a one-piece tiltable valve 114 as previously described coupled to a support member 616. The support member 616 may include a support ring 634 and a spacer 636, such as the tubular spacer shown. Other spacer configurations may be used. The support ring 634 may include flow restrictors 633, which may be arranged about the support ring 634 and jut or protrude into the flow path of the process gas as the process gas passes through the flow passages 616P to the exit 103E. Flow restrictors 633 may be of any suitable shape and may be provided at one or more than one location in one or all of the flow passages 616P. Flow restrictors 633 may be provided in a uniform or non-uniform pattern, as desired. Flow restrictors 633 may function to add flow anomalies that may help the flow uniformity. Couplings 620 may each attach to the support ring 614 adjacent to the location of the spokes 638 of the support ring 634.

Each coupling 620 may include a combination ball joint and linear slide with a rod end 724 attached to the actuator shaft 725 of the actuator 115A and a linear slide 740 attached to the support member 616. Linear slide 740 may be of any configuration that will allow lateral sliding motion due to foreshortening between the bottom 101B and the support member 616. In particular, a T-slot may be provided in a first linear slide member 742 and a T-shaped member may be formed on a second linear slide member 744. Second linear slide member 744 may be coupled to the support member 616 such as by fasteners (not shown). The first linear slide member 742 may be coupled to a shaft 724S of the rod end 724 by threading, a captured nut, or the like. The T-shaped member may be provided on the first linear slide member 742 and T may be provided on the second linear slide member 744 in some embodiments. Several flexible bellows 730A, 730B may be used to seal between the bottom 101B and the support member 616.

Figure 8:
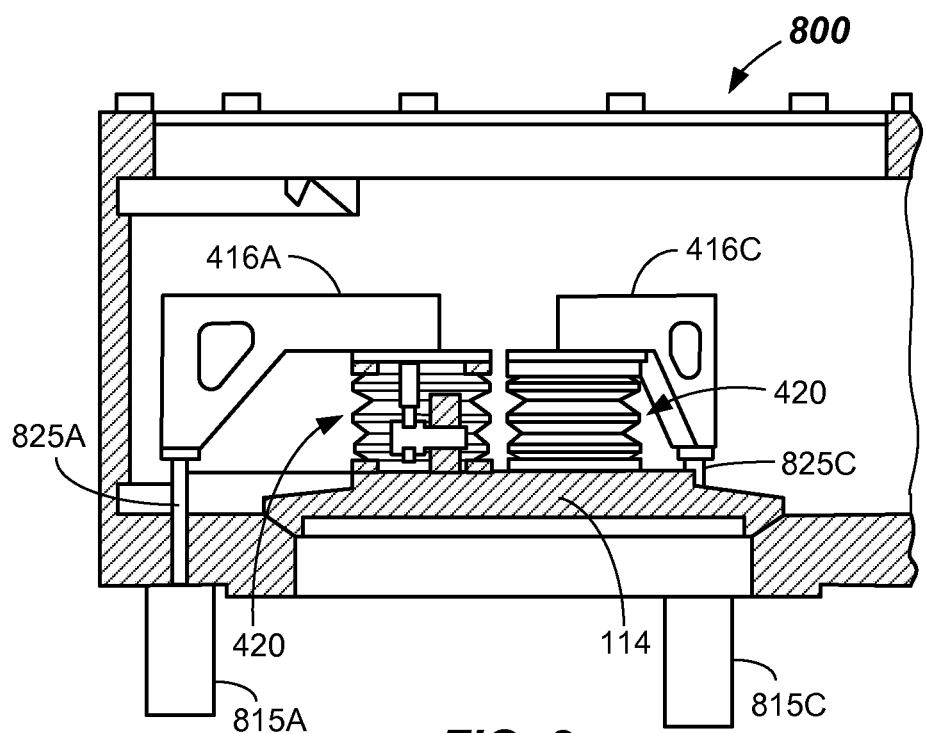
FIG. 8 illustrates a cross-sectioned side view of an alternative embodiment of a process chamber gas flow control apparatus having a tiltable valve supported by a plurality of support members according to embodiments.

FIG. 8 illustrates yet another alternative embodiment of a tiltable valve assembly within an electronic device processing system 800. In this embodiment, the couplings 420, as were previously described in FIG. 4, may be coupled between the tiltable valve 114 and the support members 416A-416C. In this embodiment, each support member 416A-416C may be individually attached to a respective actuator 815A-815C (support member 416B and actuator 815B are not shown in this view). The valve assembly includes a one-piece tiltable valve 114, as previously described, having each of the couplings 420 attached to an upper surface thereof. The support members 416A-416C may coupled between a respective coupling 420 and a respective shafts 825A-825C of the actuator 815A-815C.

Figure 9:
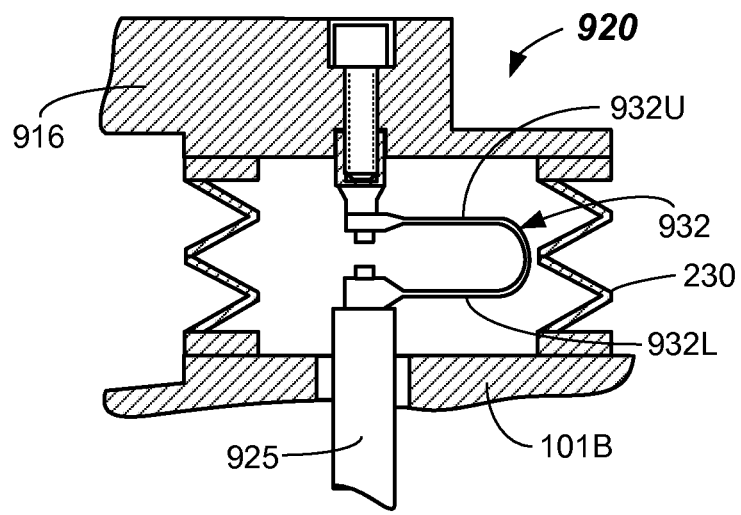
FIG. 9 illustrates a cross-sectioned partial side view of an alternative angular misalignment and foreshortening apparatus including a flexure according to embodiments.

Another alternative coupling 920 is shown in FIG. 9. In this embodiment, a leaf spring type flexure 932 is configured and adapted to accommodate the angular misalignment due to tilt of the tilting valve 114. In the depicted embodiment, the coupling 920 may attach between the shaft 925 and the support member 916. However, the coupling 920 could also be configured as in FIG. 8 where the coupling 920 would be coupled between the support member 416A-C and the tiltable valve 114. As previously described for the flexure 332 shown in FIG. 3, the flexure 932 may couple to the support member 916 by fasteners such as screws, bolts or the like. Likewise, flexure 932 may couple to the shaft 925 by fasteners such as screws, bolts or the like. Flexure 932 may comprise overlapping leaves 932U, 932L for example. The flexure 932 may be manufactured from a flexible material such as steel, and may be suitably thin to exhibit spring-like qualities. As shown, a flexible bellow 230 may be included to seal around the coupling 930.

Figure 10:
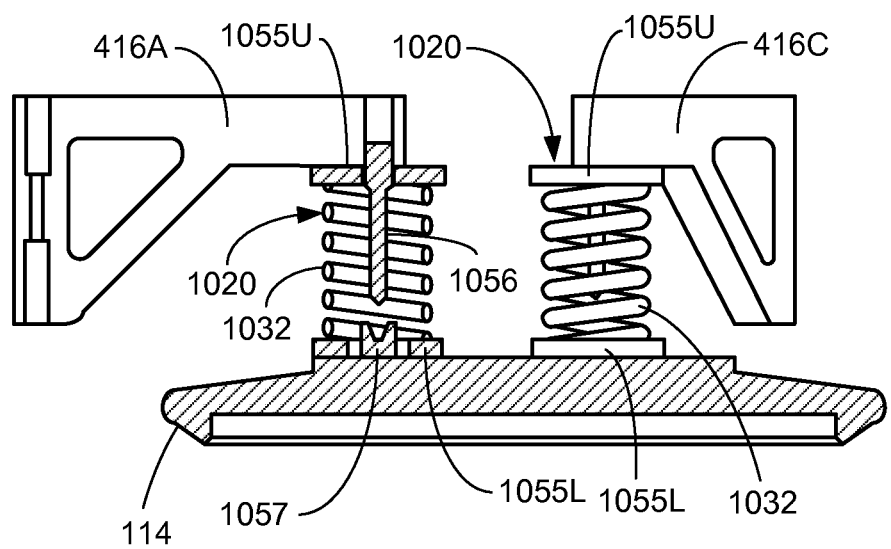
FIG. 10 illustrates a cross-sectioned view of an alternative embodiment of a process chamber gas flow control apparatus having a tiltable valve supported by a plurality of support members according to embodiments.
Figure 11:
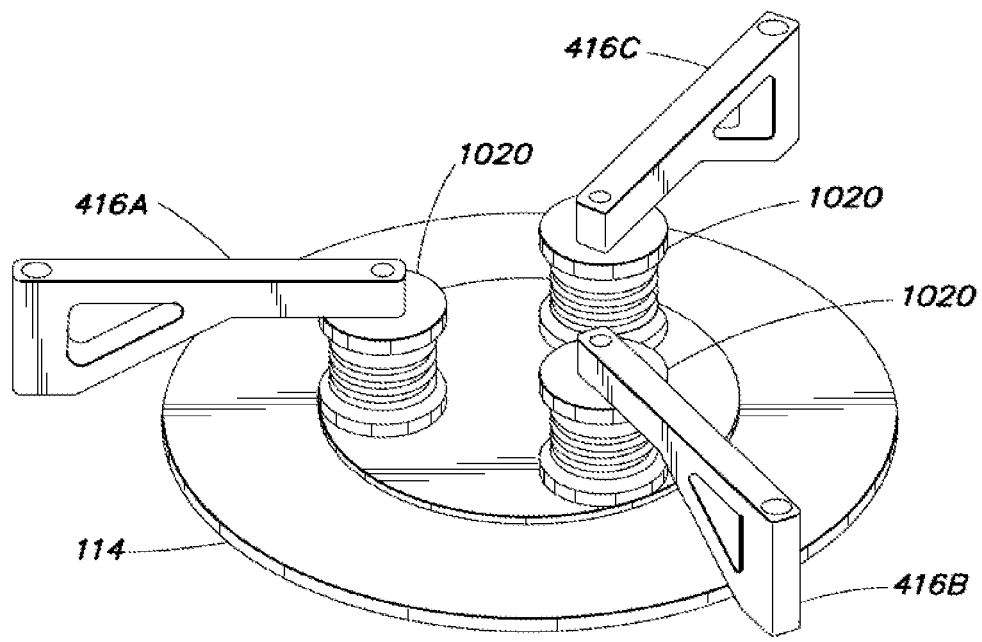
FIG. 11 illustrates a top isometric view of the alternative embodiment of a process chamber gas flow control apparatus of FIG. 10.
Figure 12:
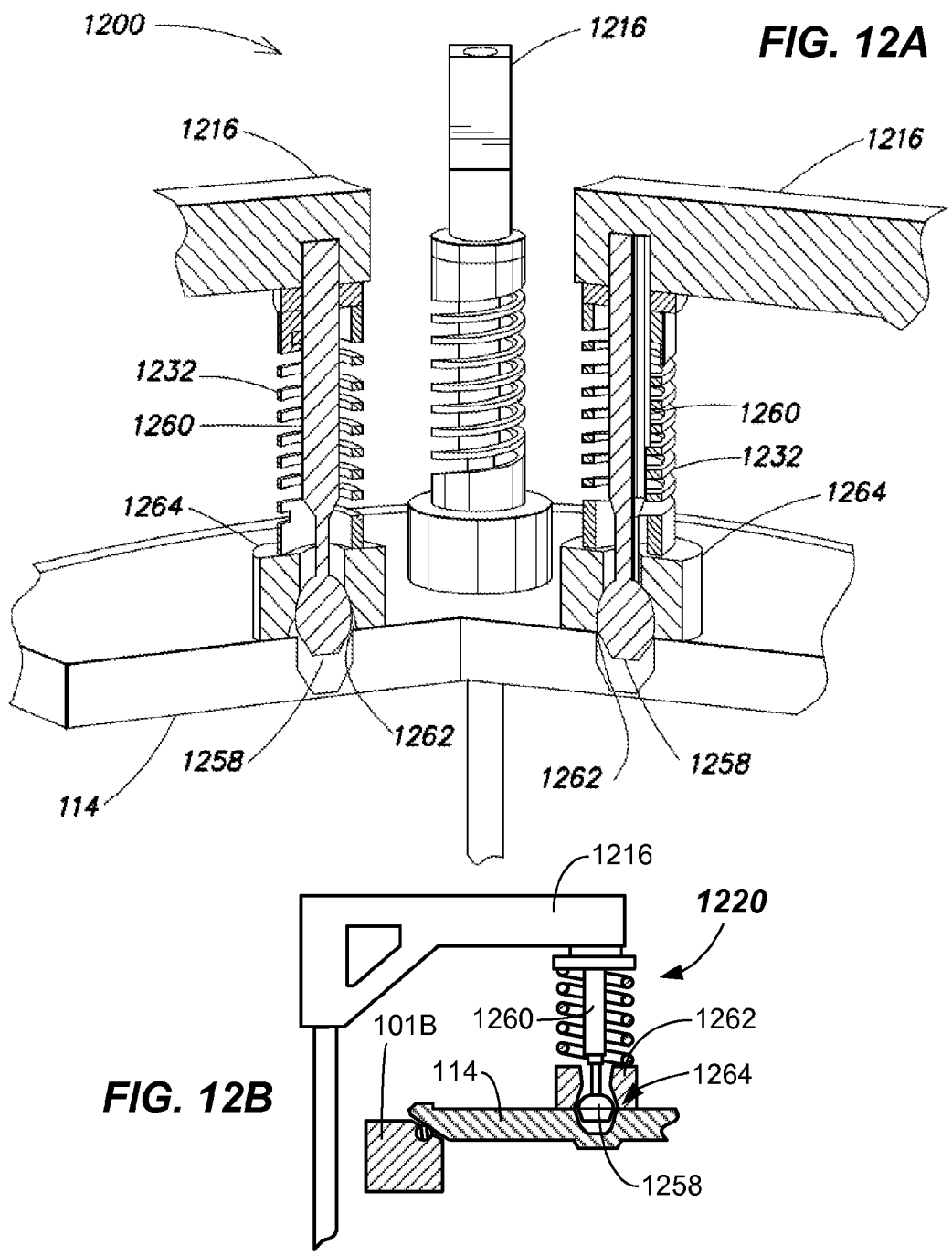
FIG. 12A illustrates a top isometric view of the alternative embodiment of a process chamber gas flow control apparatus according to embodiments.
FIG. 12B illustrates a cross-sectioned partial side view of an alternative angular misalignment and foreshortening apparatus according to embodiments.

FIGS. 10 and 11 illustrate another alternative embodiment of a tiltable valve assembly for use within an electronic device processing system (e.g., electronic device processing system 800). In this embodiment, the couplings 1020 may be coupled between the tiltable valve 114 and the individual support members 416A-416C as previously described. Actuators (e.g., actuators 415A-415C) may be attached to each of the respective support members 416A-416C. The valve assembly includes a one-piece tiltable valve 114, as previously described, having each of the couplings 1020 attached to an upper surface thereof. The support members 416A-416C may coupled between a respective coupling 1020 and a respective shaft of an actuator (not shown in FIGS. 10-11). The coupling 1020 may include a coil spring type flexure 1032 configured and adapted to accommodate the angular misalignment due to tilting the tiltable valve 114 as well as foreshortening. The coil spring flexure 1032 may be coupled to end members 1055U, 1055L such as by welding or spring retainers. Contacts 1056 may be provided to firmly close the tiltable valve 114 by contact with a contact receiver 1057 coupled to the tiltable valve 114 when the tiltable valve 114 is in full contact with the valve seat 112. In this manner, excellent flexibility and tilt accommodation is provided, but substantial sealing forces may be developed.

FIG. 12A and 2B illustrates and alternative embodiment of the valve assembly 1200 and couplings 1220 thereof.

Valve assembly 1200 includes a one-piece tiltable valve 114, as previously described, that is coupled to support members 1216. Couplings 1220 may each attach between each support member 1216 and the tiltable valve 114.

Each coupling 1220 may include a ball joint having a ball 1258 attached to the support member 1216. The ball 1258 may be coupled to the support member 1216 by a connector 1260. Connector 1260 may be integral with the ball 1258 in some embodiments and the connector 1260 may be threaded into the support member 1216, for example. Ball 1258 is received in socket 1262 formed at the tiltable valve 114. The socket 1262 may be formed by a socket member 1264 coupled to or integral with the tiltable valve 114. Some portion of the socket 1262 may be formed by the tiltable valve 114. A spring 1232 may be coupled between the support member 1216 and the tiltable valve 114. Together, the ball 1258 and socket 1262 for the ball joint.

The ball may include a partial spherical region on a top portion that may interface with a conical region inside the socket member 1264. This configuration will accommodate foreshortening as well as the angular misalignment between the vale seat and the tiltable valve 114. Positive closure of the tiltable valve 114 may be accomplished by the bottom of the ball 1258 being received in contact with a recess in the tiltable valve 114. For example, a conical portion on a bottom of the ball 1258 may contact a conical surface in the recess.

Figure 13:
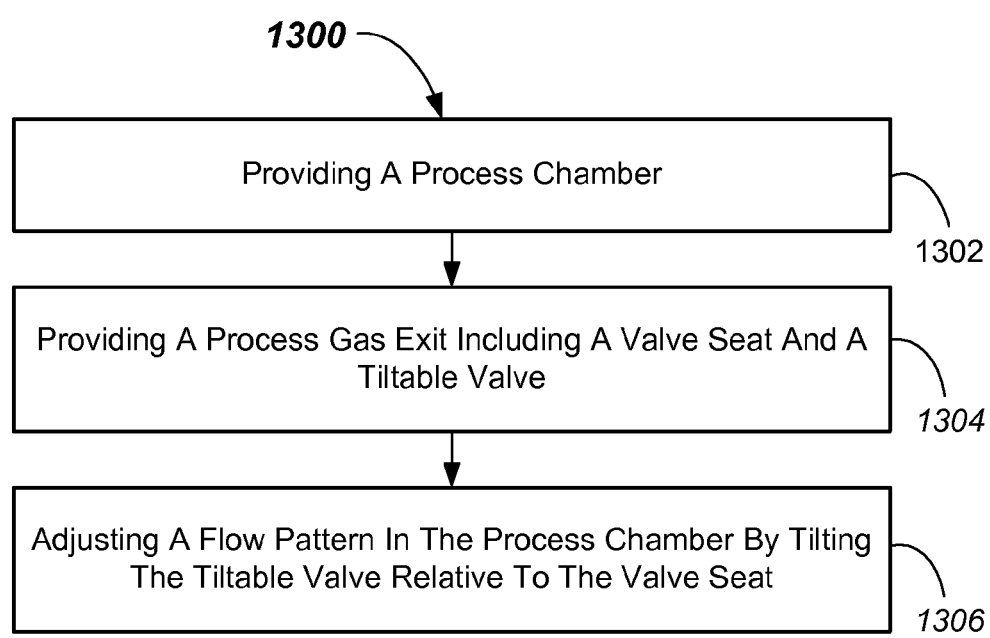
FIG. 13 is a flowchart depicting a method of controlling flow of a process gas within a process chamber according to embodiments.

A method 1300 of controlling flow of a process gas within a process chamber (e.g., process chamber 102) according to one or more embodiments the present invention is provided and described with reference to FIG. 13. The method 1300 includes, in 1302, providing a process chamber (e.g., process chamber 102), and, in 1304, providing a process gas exit (e.g., process gas exit 103E) including a valve seat (e.g., valve seat 112) and a tiltable valve (e.g., tiltable valve 114). In 1306, a flow pattern is adjusted in the process chamber by tilting the tiltable valve relative to the valve seat. In one or more embodiments, the tilting of the tiltable valve comprises actuating the tiltable valve with a plurality of actuators (e.g., actuators 115A-115C, etc.). In another method aspect, foreshortening due to the tilting of the tiltable valve may be accommodated by one or more couplings, as described herein. The coupling accommodates rotational misalignment due to the tilting of the tiltable valve. In one or more embodiments, the tilting of the tiltable valve is provided by actuating one or a plurality of support members coupled to the tiltable valve. A primary goal of the method comprises minimizing a non-uniformity of a gas flow pattern within the process chamber by the tilting of the tiltable valve.

Figure 14:
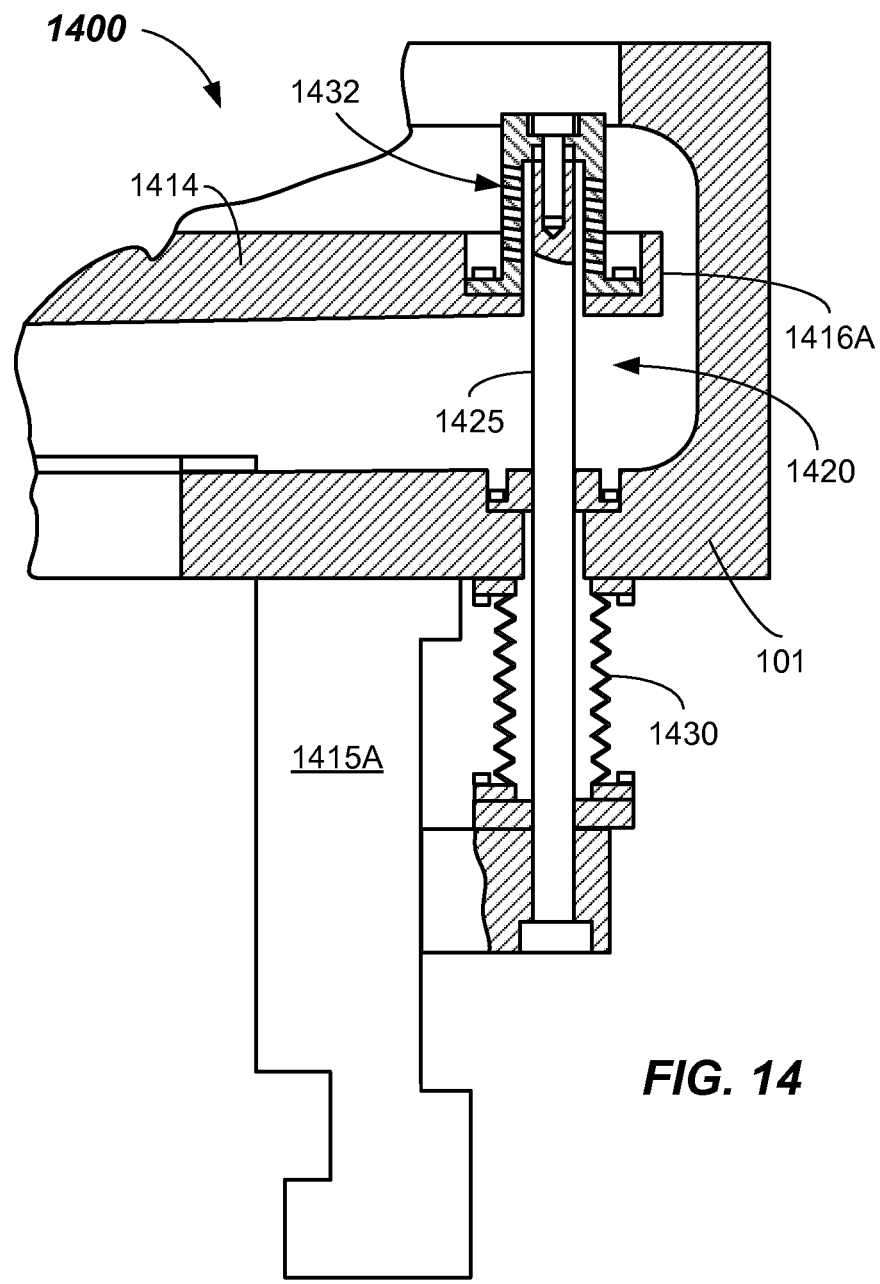
FIG. 14 illustrates a cross-sectioned partial side view of a gas flow control apparatus having an alternative tiltable valve assembly according to embodiments.
Figure 15:
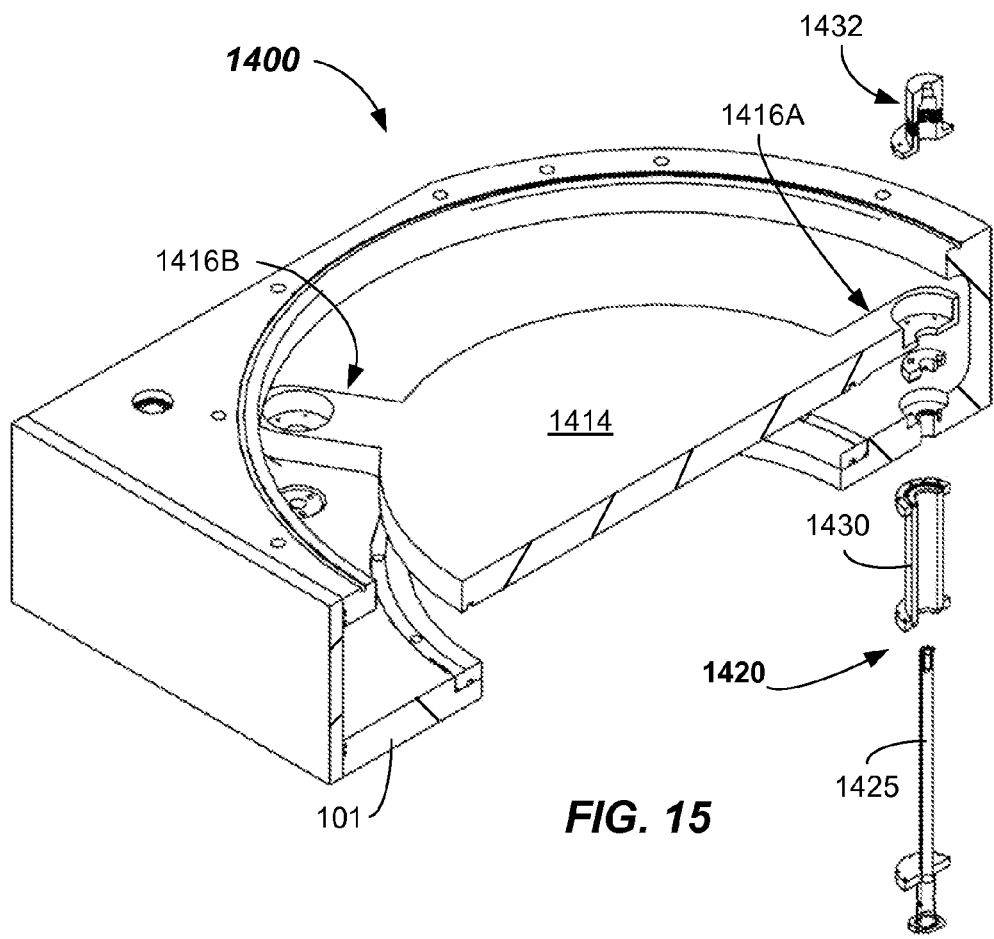
FIG. 15 illustrates a partial perspective view of a gas flow control apparatus having an alternative tiltable valve assembly according to embodiments.
Figure 16:
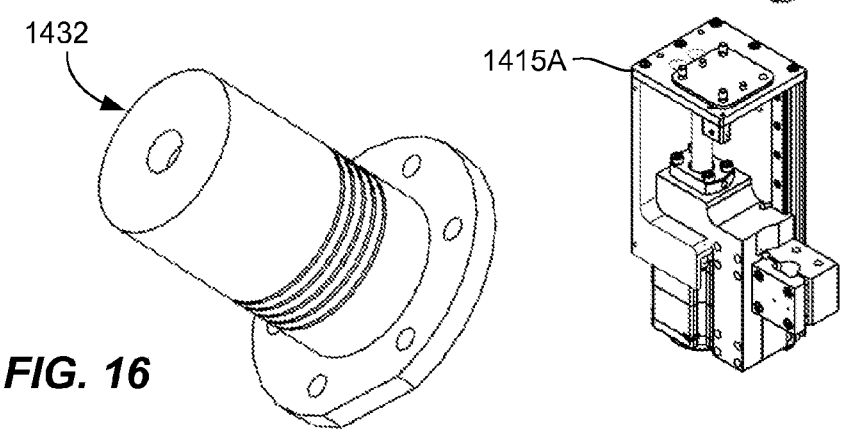
FIG. 16 illustrates a perspective view of a flexure of an alternative tiltable valve assembly according to embodiments.

FIGS. 14 through 16 illustrates a process chamber gas flow control apparatus including an alternative tiltable valve assembly 1400. The tiltable valve assembly 1400 includes a tiltable valve 1414 (e.g., a solid disc) that may be supported by a plurality of support members 1416A-1416B. An additional support member (not shown), like support member 1416A, may be positioned at an equal distance from support member 1416A and support member 1416B. Actuators, like actuator 1415A (one shown, but three identical actuators may be included), may be attached directly to the respective support members 1416A, 1416B and the other support member (not shown) by couplings 1420. Each coupling 1420 may be identical and may include a flexure 1432, wherein the flexures 1432 may accommodate both angular misalignment due to tilt of the tiltable valve 1414, as well as foreshortening displacement due to the tilt.

Tiltable valve assembly 1400 includes a one-piece tiltable valve 1414, such as the plate-shaped valve shown, that may be coupled to the support members (e.g., support members 1416A, 1416B and the other). The support members 1416A, 1416B and the other may be coupled to the tiltable valve 1414 by being integral or being attached as separate members. Other support member configurations may be used. Support members 1416A, 1416B and the other may comprise tab extensions to which the couplings (like coupling 1420) may attach. Couplings 1420 may each attach to the respective support members 1416A, 1416B, and the other Snot shown).

In the embodiment shown, the tiltable valve assembly 1400 includes the tiltable valve 1414, the actuator 1415A is configured and adapted to tilt the tiltable valve 1414, a support member (e.g., 1416A) coupled to the tiltable valve 1414, a flexure 1432 coupled to the support member 1416A, and an actuator shaft 1425 coupled to the actuator 1415A and to the flexure 1432. In the depicted embodiment, the flexure 1432 may be a double start machined spring member, for example. Flexures 1432 may be secured into a pocket formed in the respective support members 1416A, 1416B, and the other, by suitable fasteners. Other suitable flexures types may be substituted. Three identical couplings 1420 and actuators (like actuator 1415A) may be coupled to the respective support members 1416A, 1416B and the other.

A bellows 1430 may be provided that seals between the actuator shaft 1425 and a housing 101 including the process chamber 102. The bellows 1430 may be coupled to an actuator shaft 1425 and the housing 101 by threaded fasteners, or the like.

The tiltable valve assembly 1400 is operable to tilt through signals to the actuators (e.g., 1415A and others) to tilt the tiltable valve 1414 as desired. As in the previous embodiments, the actuators (e.g., 1415A and others) may be operated in unison to raise and lower the tiltable valve 1414 to control average flow rate through the process chamber. They may also be operated independently to cause tilting. Combinations of raising and lowering of the actuators may be used to control both conductance and flow non-uniformities. In the depicted embodiment, re-zeroing of the respective positions of the actuators (e.g., actuator 1415A and others) may be accomplished by lowering the tiltable valve 1414 into contact with the valve seat. The flexures 1432 allow the tiltable valve 1414 to move position slightly (e.g., tilt) to accomplish improved valve sealing upon closure of the tiltable valve 1414.

The foregoing description discloses only example embodiments of the invention. Modifications of the above-disclosed apparatus, systems, and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the following claims.

The invention claimed is:

1. A method of controlling flow of a process gas within a process chamber, comprising:
 providing a process chamber adapted to contain a substrate;
 providing a side opening adapted to allow the substrate to be provided to and withdrawn from the process chamber;
 providing a process gas inlet to the process chamber;
 providing a process gas exit including a valve seat and a tiltable valve; and
 adjusting a flow pattern in the process chamber by tilting the tiltable valve relative to the valve seat.

2. A method of claim 1, wherein the tilting of the tiltable valve comprises actuating the tiltable valve with a plurality of actuators.

3. A method of claim 1, comprising accommodating rotational misalignment due to the tilting of the tiltable valve.

4. A method of claim 1, comprising accommodating foreshortening due to the tilting of the tiltable valve.

5. A method of claim 1, comprising substantially minimizing a non-uniformity in the flow pattern in the process chamber by the tilting of the tiltable valve.

6. A process chamber gas flow control apparatus, comprising:
   a process chamber adapted to contain a substrate;
   a side opening adapted to allow the substrate to be provided to and withdrawn form the process chamber;
   a process gas inlet to the process chamber;
   a process gas exit from the process chamber including a valve seat; and
   a tiltable valve configured and adapted to tilt relative to the valve seat to control a gas flow pattern within the process chamber.

7. The process chamber gas flow control apparatus of claim 6, comprising a substrate support upon which a substrate is adapted to rest, and the valve seat and tiltable valve are located below the substrate support.

8. The process chamber gas flow control apparatus of claim 6, comprising a plurality of actuators that are operable to tilt the tiltable valve relative to the valve seat.

9. The process chamber gas flow control apparatus of claim 6, comprising a coupling adapted to accommodate foreshortening due to tilting of the tiltable valve.

10. The process chamber gas flow control apparatus of claim 9, wherein the coupling comprises a spherical joint and a linear slide.

11. The process chamber gas flow control apparatus of claim 6, comprising a flexure adapted to accommodate foreshortening due to tilting of the tiltable valve.

12. The process chamber gas flow control apparatus of claim 11, wherein the flexure comprises double start machined spring member.

13. The process chamber gas flow control apparatus of claim 6, comprising:
   a tiltable valve assembly including:
      the tiltable valve;
      an actuator adapted to tilt the tiltable valve;
      a support member coupled to the tiltable valve;
      a flexure coupled to the support member; and
      an actuator rod coupled to the actuator and the flexure.

14. The process chamber gas flow control apparatus of claim 13, comprising:
   a bellows that seals between the actuator rod and a housing including the process chamber.

15. The process chamber gas flow control apparatus of claim 6, comprising a support member coupled to the tiltable valve.

16. The process chamber gas flow control apparatus of claim 6, wherein the tiltable valve comprises a solid disc.

17. The process chamber gas flow control apparatus of claim 6, comprising:
   a plurality of support members coupled to the tiltable valve; and
   an actuator coupled to each one of the plurality of support members.

18. The process chamber gas flow control apparatus of claim 6, comprising:
   a plurality of actuators operable to tilt the tiltable valve; and
   a combination ball joint and linear slide coupled to the tiltable valve and adapted to accommodate angular misalignment and foreshortening displacement due to the tilt.

19. The process chamber gas flow control apparatus claim 6, comprising:
   one or more bellows that:
      seal between a support member and the tiltable valve, or
      seal between a bottom of a housing and the support member.

20. An electronic device processing system, comprising:
   a process chamber adapted to contain a substrate;
   a side opening adapted to allow the substrate to be provided to and withdrawn from the process chamber;
   a process gas inlet to the process chamber; and
   a process gas exit from the process chamber including a valve seat and a tiltable valve, the tiltable valve being configured and adapted to tilt relative to the valve seat to adjust a gas flow pattern within the process chamber.

* * * * *